US009183626B2

(12) United States Patent
Zhao et al.

(10) Patent No.: US 9,183,626 B2
(45) Date of Patent: Nov. 10, 2015

(54) SYSTEMS AND METHODS FOR ACCELERATED ARTERIAL SPIN LABELING USING COMPRESSED SENSING

(71) Applicants: Li Zhao, Charlottesville, VA (US); Xiao Chen, Charlottesville, VA (US); Samuel W. Fielden, Charlottesville, VA (US); Frederick H. Epstein, Charlottesville, VA (US); John P. Mugler, III, Charlottesville, VA (US); Manal Nicolas-Jilwan, Charlottesville, VA (US); Max Wintermark, Charlottesville, VA (US); Craig H. Meyer, Charlottesville, VA (US)

(72) Inventors: Li Zhao, Charlottesville, VA (US); Xiao Chen, Charlottesville, VA (US); Samuel W. Fielden, Charlottesville, VA (US); Frederick H. Epstein, Charlottesville, VA (US); John P. Mugler, III, Charlottesville, VA (US); Manal Nicolas-Jilwan, Charlottesville, VA (US); Max Wintermark, Charlottesville, VA (US); Craig H. Meyer, Charlottesville, VA (US)

(73) Assignee: UNIVERSITY OF VIRGINIA PATENT FOUNDATION, Charlottesville, VA (US)

( * ) Notice: Subject to any disclaimer, the term of this patent is extended or adjusted under 35 U.S.C. 154(b) by 46 days.

(21) Appl. No.: 13/867,325

(22) Filed: Apr. 22, 2013

(65) Prior Publication Data
US 2013/0315461 A1 Nov. 28, 2013

Related U.S. Application Data

(60) Provisional application No. 61/636,421, filed on Apr. 20, 2012.

(51) Int. Cl.
*G06K 9/00* (2006.01)
*G06T 7/00* (2006.01)
(Continued)

(52) U.S. Cl.
CPC ........ *G06T 7/0012* (2013.01); *G01R 33/56366* (2013.01); *G01R 33/5611* (2013.01)

(58) Field of Classification Search
CPC .................................. G06T 7/00; G01R 33/00
USPC ......... 382/128, 129, 130, 131, 132, 133, 134; 378/4, 8, 21–27, 904; 600/407, 410, 600/411, 425, 427; 128/920, 922
See application file for complete search history.

(56) References Cited

U.S. PATENT DOCUMENTS

| | | |
|---|---|---|
| 4,999,580 A | 3/1991 | Meyer et al. |
| 5,233,301 A | 8/1993 | Meyer et al. |

(Continued)

OTHER PUBLICATIONS

Buxton, R. et al., "A General Kinetic Model for Quantitative Perfusion Imaging with Arterial Spin Labeling," Magnetic Resonance in Medicine, 1998, 40, pp. 383-396, Williams & Wilkins.

(Continued)

*Primary Examiner* — Abolfazl Tabatabai
(74) *Attorney, Agent, or Firm* — Troutman Sanders LLP; Ryan A. Schneider; Christopher W. Glass

(57) ABSTRACT

Systems and methods for accelerated arterial spin labeling (ASL) using compressed sensing are disclosed. In one aspect, in accordance with one example embodiment, a method includes acquiring magnetic resonance data associated with an area of interest of a subject, wherein the area of interest corresponds to one or more physiological activities of the subject. The method also includes performing image reconstruction using temporally constrained compressed sensing reconstruction on at least a portion of the acquired magnetic resonance data, wherein acquiring the magnetic resonance data includes receiving data associated with ASL of the area of interest of the subject.

72 Claims, 8 Drawing Sheets

(51) Int. Cl.
  *G01R 33/563* (2006.01)
  *A61B 5/05* (2006.01)
  *G01R 33/561* (2006.01)

(56) References Cited

U.S. PATENT DOCUMENTS

| | | | |
|---|---|---|---|
| 5,402,067 | A | 3/1995 | Pauly et al. |
| 5,427,101 | A | 6/1995 | Sachs et al. |
| 5,485,086 | A | 1/1996 | Meyer et al. |
| 5,539,313 | A | 7/1996 | Meyer |
| 5,617,028 | A | 4/1997 | Meyer et al. |
| 5,650,723 | A | 7/1997 | Meyer |
| 5,957,843 | A * | 9/1999 | Luk Pat et al. ............ 600/410 |
| 6,020,739 | A | 2/2000 | Meyer et al. |
| 7,558,612 | B2 | 7/2009 | Meyer |
| 7,583,082 | B1 | 9/2009 | Hu et al. |
| 7,642,777 | B1 * | 1/2010 | Meyer et al. ............... 324/309 |
| 7,777,487 | B2 * | 8/2010 | Ying et al. ................. 324/309 |
| 7,888,935 | B1 * | 2/2011 | Tan et al. ................... 324/309 |
| 7,898,254 | B2 * | 3/2011 | Feinberg et al. ........... 324/309 |
| 8,121,668 | B2 * | 2/2012 | Sutton et al. ............... 600/419 |
| 2003/0193337 | A1 | 10/2003 | Meyer |
| 2012/0220858 | A1 * | 8/2012 | Carroll et al. .............. 600/420 |

OTHER PUBLICATIONS

Chen, X. et al., "Accelerated Multi-Spiral MRI Using Compressed Sensing with Temporal Constraints," Proceedings of ISMRM, 2011, 19, p. 4369.

Fielden, S. et al., "Variable-flip Angle 3D-turbo Spin Echo Imaging Utilizing Spiral Acquisitions," Proceedings of ISMRM, 2011, 19, p. 2820.

Gunther, M. et al., "Single-Shot 3D Imaging Techniques Improve Arterial Spin Labeling," Magnetic Resonance in Medicine, 2005, 54, pp. 491-498, Wiley-Liss, Inc.

Lingala, S. et al., "Accelerated Dynamic MRI Exploiting Sparsity and Low-Rank Structure: k-t SLR," IEEE Transactions on Medical Imaging, 2011, 30(5), pp. 1042-1054, IEEE.

Lustig, M. et al., "SPIRit: Iterative Self-consistent Parallel Imaging Reconstruction from Arbitrary k-Space," Magnetic Resonance in Medicine, 2010, 64(2), pp. 457-471, Wiley-Liss, Inc.

* cited by examiner

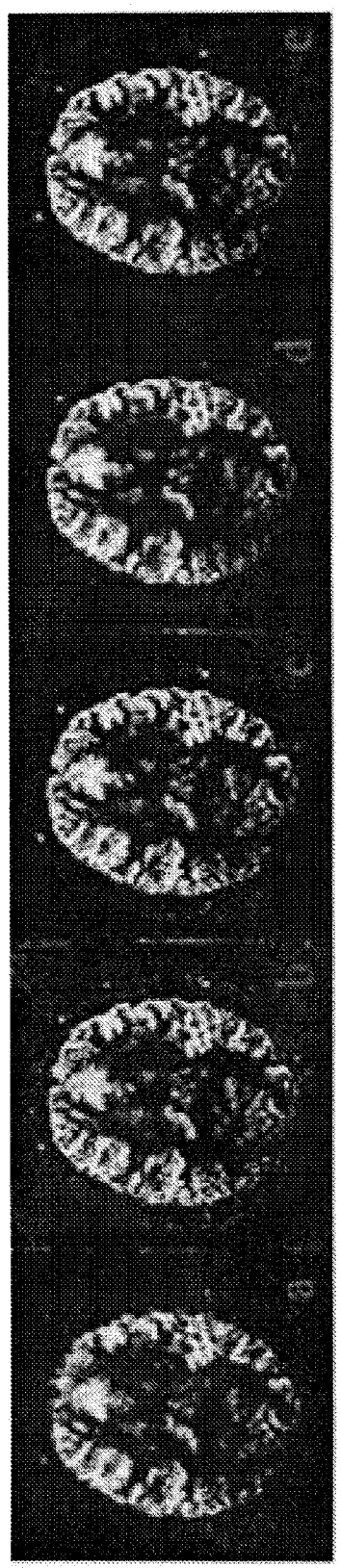

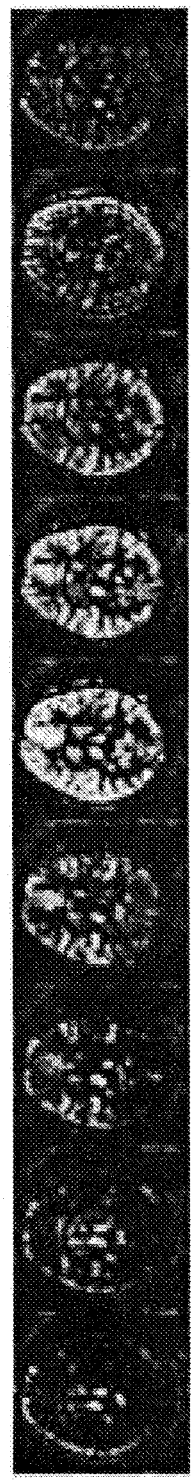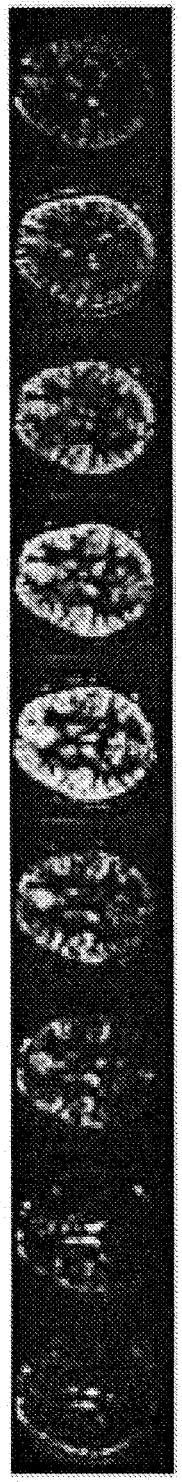
FIG. 7A
FIG. 7B

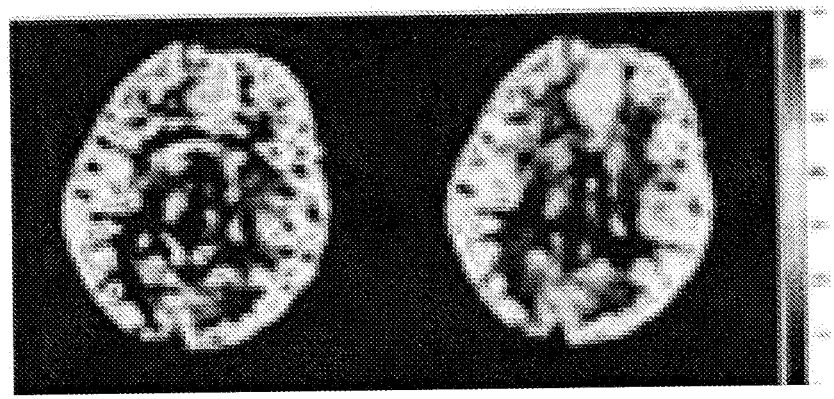
FIG. 8A  FIG. 8B

US 9,183,626 B2

SYSTEMS AND METHODS FOR ACCELERATED ARTERIAL SPIN LABELING USING COMPRESSED SENSING

CROSS-REFERENCE TO RELATED APPLICATIONS

This Application claims priority to and benefit under 35 U.S.C §119(e) of U.S. Provisional Patent Application Ser. No. 61/636,421, entitled "Method and System Accelerated Kinetic ASL using 3D Spiral TSE and Compressed Sensing," filed Apr. 20, 2012, which is hereby incorporated by reference as if fully set forth below.

Some references, which may include patents, patent applications, and various publications, are cited in a reference list and discussed in the disclosure provided herein. The citation and/or discussion of such references is provided merely to clarify the description of the present disclosure and is not an admission that any such reference is "prior art" to any aspects of the present disclosure described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [4] represents the 4th reference cited in the reference list, namely, Buxton et al., "A General Kinetic Model for Quantitative Perfusion Imaging with Arterial Spin Labeling." Magnetic Resonance in Medicine, 40:283-396 (1998).

STATEMENT OF RIGHTS UNDER FEDERALLY-SPONSORED RESEARCH

The invention was made with government support under grant R01 HL079110, awarded by the National Institute of Health. The government has certain rights in the invention.

BACKGROUND

Dynamic arterial spin labeling (ASL) can provide important diagnostic information, such as cerebral blood flow (CBF) and arterial transit time (ATT), for stroke and tumor patients. Acquiring data at multiple observation times (OTs) permits the tracking of a tagged bolus as it flows through the image. However, the inherent low signal-to-noise ratio (SNR) of ASL makes acquisition of dynamic ASL data sets time-consuming and the resulting parameter maps unreliable. It is with respect to these and other considerations that the various embodiments described below are presented.

SUMMARY

The present disclosure relates generally to magnetic resonance imaging (MRI). In one aspect, the present disclosure relates to a method for accelerated arterial spin labeling (ASL) using compressed sensing. In one example embodiment, the method includes acquiring magnetic resonance data associated with an area of interest of a subject, wherein the area of interest corresponds to one or more physiological activities of the subject. The method also includes performing image reconstruction using temporally constrained compressed sensing reconstruction on at least a portion of the acquired magnetic resonance data, wherein acquiring the magnetic resonance data includes receiving data associated with ASL of the area of interest of the subject.

In another aspect, the present disclosure relates to a system for accelerated ASL using compressed sensing. In one example embodiment, the system includes a magnetic resonance imaging (MRI) device, one or more processors, and at least one memory device in communication with the MRI device. The memory device stores computer-readable instructions that, when executed by the one or more processors, cause the system to perform functions that include acquiring magnetic resonance data associated with an area of interest of a subject, wherein the area of interest corresponds to one or more physiological activities of the subject. The functions also include performing image reconstruction, including temporally constrained compressed sensing reconstruction, on at least a portion of the acquired magnetic resonance data. Acquiring the magnetic resonance data includes receiving data associated with arterial spin labeling (ASL) of the area of interest of the subject.

In yet another aspect, the present disclosure relates to a computer-readable storage medium. In one example embodiment, the computer-readable medium has stored computer-executable instructions that, when executed by one or more processors, cause a computer to perform functions that include acquiring magnetic resonance data associated with an area of interest of a subject, wherein the area of interest corresponds to one or more physiological activities of the subject. The functions also include performing image reconstruction, including temporally constrained compressed sensing reconstruction, on at least a portion of the acquired magnetic resonance data. Acquiring the magnetic resonance data includes receiving data associated with arterial spin labeling (ASL) of the area of interest of the subject.

Other aspects and features according to the present disclosure will become apparent to those of ordinary skill in the art, upon reviewing the following detailed description in conjunction with the accompanying figures.

BRIEF DESCRIPTION OF THE DRAWINGS

Reference will now be made to the accompanying drawings, which are not necessarily drawn to scale, and wherein:

FIGS. 4A and 4B illustrate one example of practicing concepts and technologies as described herein with respect to Example 1, wherein FIG. 4A shows a flow-sensitive alternating inversion discovery (FAIR) three-dimensional (3D) turbo spin echo (TSE) sequence and FIG. 4B illustrates k-space sampling;

FIGS. 6A-6E illustrate results of reconstruction methods, including results of practicing concepts and technologies as described herein with respect to Example 2, wherein FIG. 6A corresponds to gridding, 6B corresponds to iterative self-consistent parallel image reconstruction (SPIRiT) reconstruction, FIG. 6C corresponds to SPIRiT and total variation (TV) reconstruction, FIG. 6D corresponds to SPIRiT and singular value decomposition (SVD) reconstruction, and FIG. 6E corresponds to wavelet reconstruction;

FIGS. 7A and 7B illustrate results of dynamic PCASL with different postlabeling delays (PLDs), including results of practicing concepts and technologies as described herein with respect to Example 2, wherein FIG. 7A corresponds to SPIRiT and FIG. 7B corresponds to SPIRiT with CS; and FIGS. 8A and 8B illustrate results showing images associated with cerebral blood flow (CBF) obtained using dynamic pseudocontinuous ASL (sometimes referred to as "pulsed-continuous ASL" and/or PCASL), including results of practicing concepts and technologies as described herein with respect to Example 2, wherein FIG. 8A corresponds to SPIRiT and FIG. 8B corresponds to SPIRiT with compressed sensing (CS).

DETAILED DESCRIPTION

Figure 1:
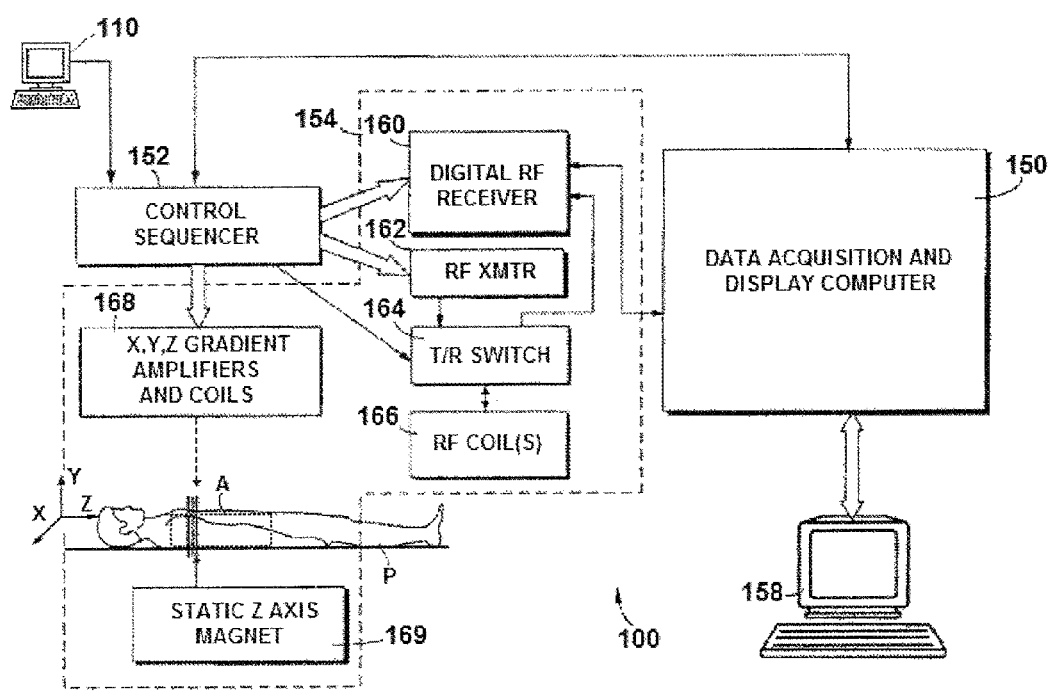
FIG. 1 is a system diagram illustrating an operating environment capable of implementing aspects of the present disclosure in accordance with one or more example embodiments.

Embodiments of the disclosed technology relate generally to magnetic resonance imaging (MRI) and more particularly to systems and methods for accelerated ASL using compressed sensing. Although example embodiments of the present disclosure are explained in detail, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise.

In describing example embodiments, terminology will be resorted to for the sake of clarity. It is intended that each term contemplates its broadest meaning as understood by those skilled in the art and includes all technical equivalents that operate in a similar manner to accomplish a similar purpose.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

Ranges may be expressed herein as from "about" or "approximately" one particular value and/or to "about" or "approximately" another particular value. When such a range is expressed, another embodiment includes from the one particular value and/or to the other particular value. As used herein, "about" means within 20 percent or closer of a given value or range.

As discussed herein, a "subject" or "patient" may be a human or any animal. It should be appreciated that an animal may be a variety of any applicable type, including, but not limited thereto, mammal, veterinarian animal, livestock animal or pet type animal, etc. As an example, the animal may be a laboratory animal specifically selected to have certain characteristics similar to a human (e.g. rat, dog, pig, monkey), etc. It should be appreciated that the subject may be any applicable human patient, for example.

It is also to be understood that the mention of one or more steps of a method does not preclude the presence of additional method steps or intervening method steps between those steps expressly identified. Steps of a method may be performed in a different order than those described herein. Similarly, it is also to be understood that the mention of one or more components in a device or system does not preclude the presence of additional components or intervening components between those components expressly identified.

The following detailed description is directed to systems and methods for accelerated arterial spin labeling (ASL) using compressed sensing. In the following detailed description, references are made to the accompanying drawings that form a part hereof and that show, by way of illustration, specific embodiments or examples. In referring to the drawings, like numerals represent like elements throughout the several figures.

FIG. 1 is a system diagram illustrating an operating environment capable of implementing aspects of the present disclosure in accordance with one or more example embodiments. Embodiments may be implemented on a commercial MRI system. FIG. 1 illustrates an example of such an MRI system 100, including a data acquisition and display computer 150 coupled to an operator console 110, a MRI real-time control sequencer 152, and a MRI subsystem 154. The MRI subsystem 154 may include XYZ magnetic gradient coils and associated amplifiers 168, a static Z-axis magnet 169, a digital RF transmitter 162, a digital RF receiver 160, a transmit/receive switch 164, and RF coil(s) 166. The MRI subsystem 154 may be controlled in real time by control sequencer 152 to generate magnetic and radio frequency fields that stimulate magnetic resonance phenomena in a living subject, patient P, to be imaged. A contrast-enhanced image of an area of interest A of the patient P may be shown on display 158.

The area of interest A corresponds to a region associated with one or more physiological activities in patient P. The area of interest shown in the example embodiment of FIG. 1 corresponds to a chest region of patient P. It will be appreciated that area of interest A can additionally or alternatively correspond to, but is not limited to, one or more of a brain region, cardiac region, and upper or lower limb regions of the patient P. Display 158 may be implemented through a variety of output interfaces, including a monitor, printer, or data storage. It will be appreciated that any number and type of computer-based tomography imaging systems or components, including various types of magnetic resonance imaging systems, may be used to practice aspects of the present disclosure, and the disclosure should not be limited to the type of MRI subsystem shown in FIG. 1.

Figure 2:
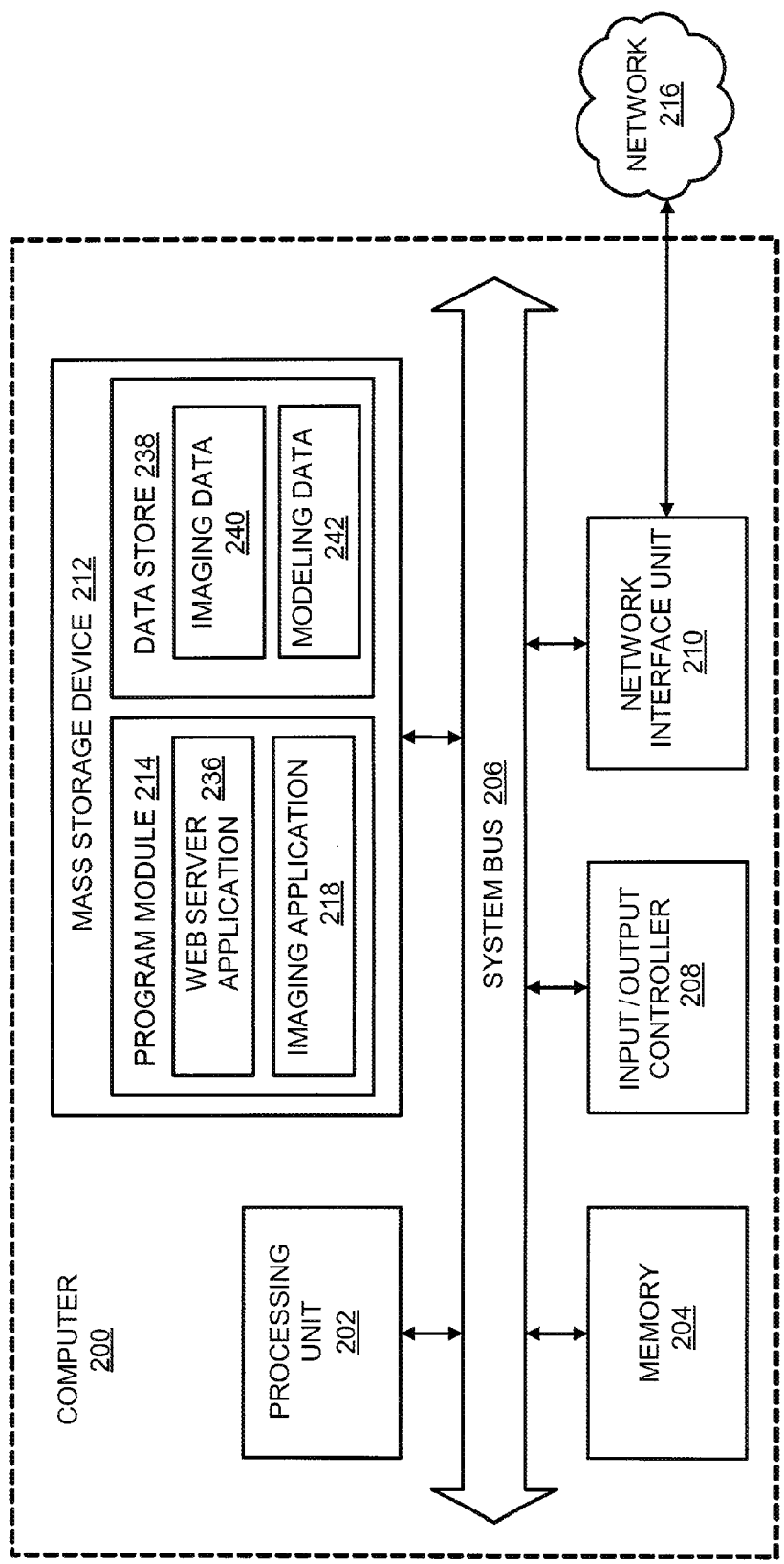
FIG. 2 is a computer architecture diagram showing illustrative computer hardware architecture for a computing system capable of implementing aspects of the present disclosure in accordance with one or more example embodiments.

FIG. 2 is a computer architecture diagram showing illustrative computer hardware architecture for a computing system capable of implementing aspects of the present disclosure in accordance with one or more example embodiments described herein. An example implementation of the computer 200 may include the data acquisition and display computer 150 of FIG. 1. The computer 200 includes a processing unit 202 ("CPU"), a system memory 204, and a system bus 206 that couples the memory 204 to the CPU 202. The computer 200 further includes a mass storage device 212 for storing program modules 214. The program modules 214 may be operable to perform various operations discussed below with respect to FIGS. 3-8 and may include a web server application 236 and an imaging application 218. The computer can include a data store 238 for storing data that may include imaging-related data 240 such as image acquisition data, and a modeling data store 242 for storing image modeling data, or other various types of data utilized in practicing aspects of the present disclosure.

The mass storage device 212 is connected to the CPU 202 through a mass storage controller (not shown) connected to the bus 206. The mass storage device 212 and its associated computer-storage media provide non-volatile storage for the computer 200. Although the description of computer-storage media contained herein refers to a mass storage device, such as a hard disk or CD-ROM drive, it should be appreciated by those skilled in the art that computer-storage media can be any available computer storage media that can be accessed by the computer 200.

By way of example, and not limitation, computer-storage media may include volatile and non-volatile, removable and non-removable media implemented in any method or technology for storage of information such as computer-storage instructions, data structures, program modules, or other data. For example, computer storage media includes, but is not limited to, RAM, ROM, EPROM, EEPROM, flash memory or other solid state memory 10 technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer 200.

According to various embodiments, the computer 200 may operate in a networked environment using logical connections to remote computers through a network 216. The computer 200 may connect to the network 216 through a network interface unit 210 connected to the bus 206. It should be appreciated that the network interface unit 210 may also be utilized to connect to other types of networks and remote computer systems. The computer 200 may also include an input/output controller 208 for receiving and processing input from a number of input devices. The bus 206 may enable the processing unit 202 to read code and/or data to/from the mass storage device 212 or other computer-storage media. The computer-storage media may represent apparatus in the form of storage elements that are implemented using any suitable technology, including but not limited to semiconductors, magnetic materials, optics, or the like.

The computer-storage media may represent memory components, whether characterized as RAM, ROM, flash, or other types of technology. The computer-storage media may also represent secondary storage, whether implemented as hard drives or otherwise. Hard drive implementations may be characterized as solid state, or may include rotating media storing magnetically-encoded information. The program modules 214, which include the imaging application 218, may include software instructions that, when loaded into the processing unit 202 and executed, cause the computer 200 to provide functions for accelerated arterial spin labeling (ASL) using compressed sensing, according to aspects of the present disclosure described herein in accordance with example embodiments. The program modules may also provide various tools or techniques by which the computer 200 may participate within the overall systems or operating environments using the components, flows, and data structures discussed throughout this description.

In general, the program modules 214 may, when loaded into the processing unit 202 and executed, transform the processing unit 202 and the overall computer 200 from a general-purpose computing system into a special-purpose computing system. The processing unit 202 may be constructed from any number of transistors or other discrete circuit elements, which may individually or collectively assume any number of states. More specifically, the processing unit 202 may operate as a finite-state machine, in response to executable instructions contained within the program modules 214. These computer-executable instructions may transform the processing unit 202 by specifying how the processing unit 202 transitions between states, thereby transforming the transistors or other discrete hardware elements constituting the processing unit 202.

Encoding the program modules 214 may also transform the physical structure of the computer-storage media. The specific transformation of physical structure may depend on various factors, in different implementations of this description. Examples of such factors may include, but are not limited to the technology used to implement the computer-storage media, whether the computer storage media are characterized as primary or secondary storage, and the like. For example, if the computer-storage media are implemented as semiconductor-based memory, the program modules 214 may transform the physical state of the semiconductor memory, when the software is encoded therein. For example, the program modules 214 may transform the state of transistors, capacitors, or other discrete circuit elements constituting the semiconductor memory.

As another example, the computer-storage media may be implemented using magnetic or optical technology. In such implementations, the program modules 214 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. Other transformations of physical media are possible without departing from the scope of the present description, with the foregoing examples provided only to facilitate this discussion.

Figure 3:
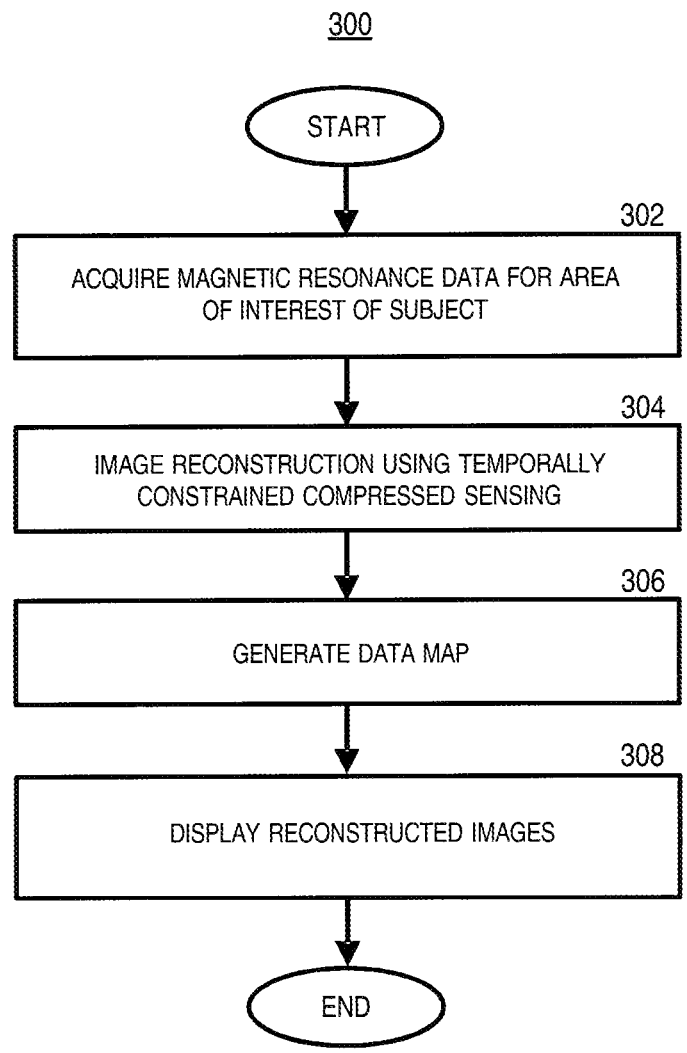
FIG. 3 is a flow chart illustrating operations of a method for accelerated arterial spin labeling (ASL) with temporally constrained compressed sensing (CS) reconstruction, in accordance with one example embodiment of the present disclosure.

FIG. 3 is a flow chart illustrating operations of a method 300 in accordance with one example embodiment of the present disclosure. The method 300 begins at block 302, where magnetic resonance data associated with an area of interest of a subject is acquired. The area of interest corresponds to one or more physiological activities of the subject. Acquiring the magnetic resonance data includes receiving data associated with arterial spin labeling (ASL) of the area of interest of the subject. At block 304, image reconstruction is performed on at least a portion of the acquired magnetic resonance data. The image reconstruction includes temporally constrained compressed sensing reconstruction. At block 306, a data map is generated that is associated with the acquired magnetic resonance data. At block 308, a visual representation of reconstructed images generated by the temporally constrained compressed sensing image reconstruction is displayed. The method 300 ends following block 308.

EXAMPLE IMPLEMENTATIONS AND RESULTS

The following describes examples of practicing concepts and technologies presented herein, and corresponding results, in accordance with aspects of the present disclosure.

Example 1

Among other advantages and benefits provided by practicing concepts and technologies according to Example 1 as described herein, three-dimensional (3D) acquisition improves signal-to-noise ratio (SNR) [1] and compressed sensing (CS) can exploit the underlying spatiotemporal sparsity efficiently [2], thus leading to a rapid kinetic ASL acquisition. A kinetic ASL technique is described, which uses multi-inversion time (multi-TI) flow-sensitive alternating inversion discovery (FAIR) with a 3D spiral turbo spin echo (TSE) readout [3] combined with acceleration using compressed sensing.

Methods

Figure 4B:
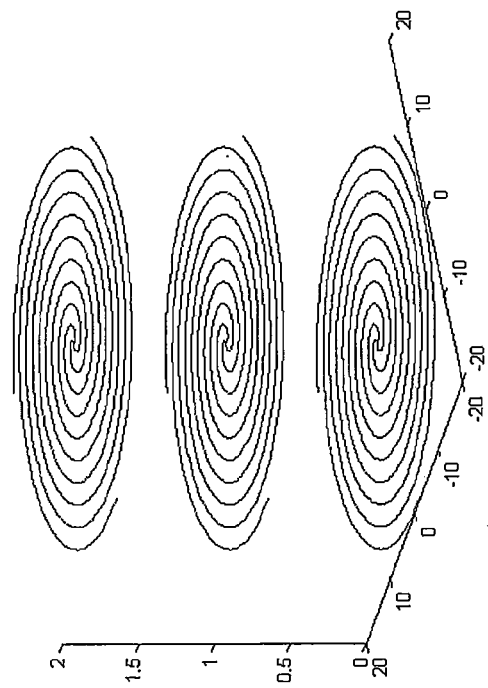
Figure 4A:
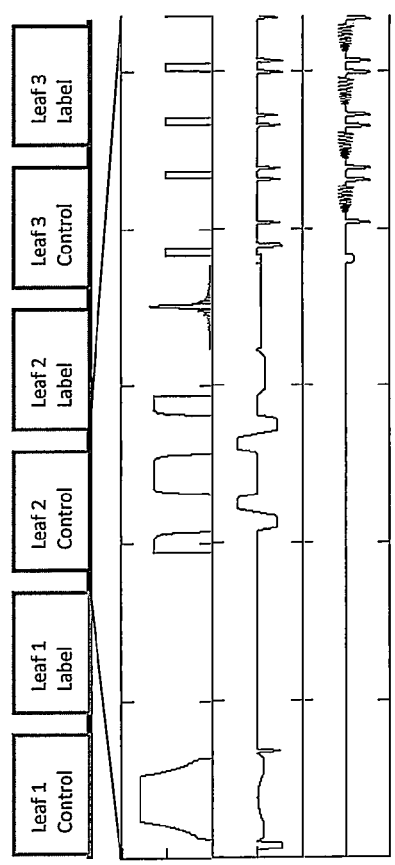
Figure 5A:
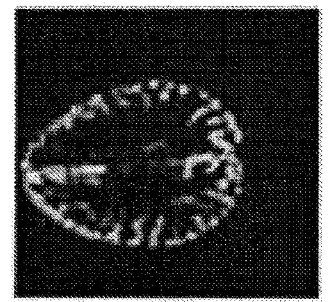
FIGS. 5A and 5B illustrate results of 3D spiral TSE-FAIR according to one example of practicing concepts and technologies as described herein with respect to Example 1, wherein FIG. 5A corresponds to full sampling (TI=1600 ms), FIG. 5B corresponds to compressed sensing (TI=1600 ms, R=3), FIG. 5C corresponds to cerebral blood flow (CBF) (ml/100 g/min), and FIG. 5D corresponds to arterial transit time (ATT)
Figure 5B:
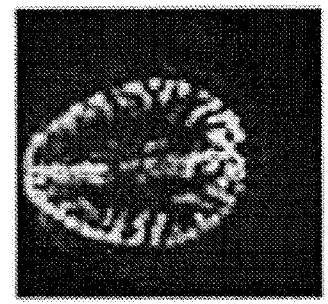
Figure 5C:
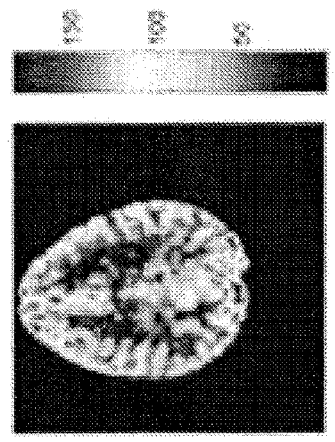
Figure 5D:
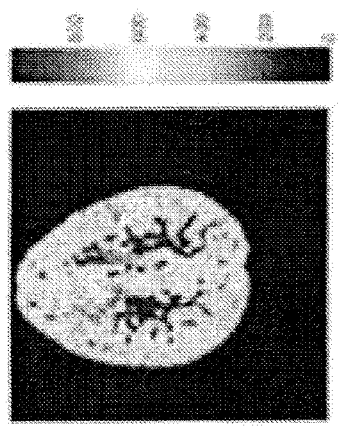

Experiments were performed on a Siemens Trio 3.0T scanner. The flow-sensitive alternating inversion recovery (FAIR) tagging used a frequency offset corrected inversion (FOCI) pulse (1000 mm slice thickness for control image, 80 mm slice thickness for label image). Referring to FIGS. 4A and 4B, the signal was sampled using a three-dimensional (3D) turbo spin echo (TSE) stack of spirals with the phase encoding along the z direction. Each echo train repetitively sampled a particular spiral interleaf as the z phase encoding symmetrically sampled kz. FIG. 4A shows a FAIR 3D TSE sequence and FIG. 4B illustrates k-space sampling. Three spiral interleaves were required for full sampling, resulting in an in-plane resolution of 4.0×4.0 mm. The readouts were constant-density 6-ms spirals. Slab excitation and chopping were performed by alternating the phase of the refocusing pulses during signal averaging. BIR4 pulses and flow-sensitizing gradients were used to suppress blood flow before excitation. Crushers along all three axes were used to eliminate banding artifacts.

Other parameters in the experiments were TR=5 s, TE=24 ms, FOV=200 mm, slice thickness=5 mm, 12 slices, pulse triggering, 4 signal averages. Each fully-sampled frame was collected in about 2 minutes. Nine (9) frames of images with different TIs (400, 700, 1000, 1300, 1600, 1900, 2200, 2500, 2800 ms) were collected. The data was processed in MATLAB 2011b. Compressed sensing is tested on the $9^{th}$ slice and data is undersampled off-line with an acceleration rate of 3. One-dimensional (1D) Fast Fourier Transform (FFT) is done in the slice direction of each frame first. Then, temporal constrained compressed sensing reconstruction [2] is performed on one of three interleaves in each frame. Non-Uniform Fast Fourier Transform (NUFFT) is used to transform data between k-space and image domain. A classic single-compartment dynamic PASL model [4] was used for cerebral blood flow and mean transit time (MTT) estimation from fully-sampled data. Common assumptions were made: blood $T_{1b}$=1900 ms, brain-blood partition coefficient λ=0.9. M0a was calculated from CSF recovery curve in control images and T2 decay was corrected with an assumption of T2csf=1000 ms.

Results and Discussion

As shown in FIGS. 5A-5D, 3D TSE with constant density spiral readouts yields good SNR in a short scan time. FIG. 5 illustrates results of 3D spiral TSE-FAIR wherein FIG. 5A corresponds to full sampling (TI=1600 ms), FIG. 5B corresponds to compressed sensing (T1600 ms, R=3), FIG. 5C corresponds to cerebral blood flow (CBF) (ml/100 g/min), and FIG. 5D corresponds to mean transit time (MTT) (ms). The mean CBF of selected GM ROI is about 66 ml/100 g/min. The mean MTT was about 416 ms in grey matter and 983 ms in white matter. The compressed sensing reconstruction result was similar to the fully-sampled reconstruction, other than reduction in SNR. It can be concluded that 3D kinetic spiral TSE with compressed sensing acceleration provides for rapid kinetic ASL measurements.

Example 2

Among other advantages and benefits provided by practicing concepts and technologies according to Example 2 as described herein, combining 3D spiral TSE, parallel imaging, and compressed sensing (CS) yields rapid whole-brain perfusion maps with high SNR in two settings: high-resolution single-postlabeling delay (PLD) PCASL and rapid multi-observation time (multi-OT) dynamic PCASL.

SPIRiT (iterative self-consistent parallel imaging reconstruction) [5] is an iterative non-Cartesian parallel image reconstruction method that can be combined with compressed sensing (CS). CS is known to suppress noise by enforcing sparsity through nonlinear image reconstruction. In dynamic ASL, the images from different OTs have similar structure except for gradual changes in intensity. By enforcing sparsity in the time domain, image quality and parameter map accuracy are improved.

Methods

A general constrained image reconstruction can be described by the following regularization equation:

$$\hat{x}=\arg\min:\|Fx-y\|^2+\lambda|Tx|_p$$

The first part of the equation enforces data fidelity, where x is the target image, y is the sampled data, and F is the Fourier transform. F includes the spiral trajectory and an undersampling mask. The second part of the equation enforces prior knowledge, which in CS is a sparsity constraint. In this work, T includes constraints corresponding to SPIRiT [5], spatial total variation (TV), wavelets, spatial singular value decomposition (SVD) and temporal SVD [6] in different image reconstructions.

Experiments were performed on SIEMENS Trio 3T scanners. The ASL blood bolus was tagged by balanced PCASL with Hanning RF pulses, and k-space was sampled by a 3D stack-of-spirals. The proposed method was first tested on single-PLD PCASL with high resolution. Bolus duration=2 s and PLD=800 ms. A constant density spiral with 7 interleaves provided 2 mm×2 mm×4 mm resolution. Twenty-four (24) slices covered the whole brain. Six (6) averages and 3.5 s TR resulted in a total scan time of about 5 min. Next, dynamic PCASL data with 9 OTs was acquired. Design bolus=2 s. Dual-density spiral readouts were used with 100% of Nyquist sampling during the first ¼ of the readout and 33% during the rest of the readout. Three such spiral interleaves were acquired with equal rotation in k-space, resulting in an in-plane resolution of 4.5 mm×4.5 mm. Twenty-four (24) slices, thickness=4.5 mm, averages=4, TR=5 s.

| Design OT (ms) | 600 | 1100 | 1600 | 2100 | 2600 | 3100 | 3600 | 4100 | 4600 |
|---|---|---|---|---|---|---|---|---|---|
| Bolus duration (ms) | 500 | 1000 | 1500 | 2000 | 2000 | 2000 | 2000 | 2000 | 2000 |
| Real PLD (ms) | 100 | 100 | 100 | 100 | 600 | 1100 | 1600 | 2100 | 2600 |

Discussion and Results

As shown in FIGS. 6A-6E, gridding reconstruction (FIG. 6A) produces a perfusion image with low SNR at this relatively high spatial resolution. SPIRiT reconstruction (FIG. 6B) improves the visualization of some structures, but amplifies the noise in some regions. The CS reconstructions (FIGS. 6C and 6D) show improved SNR, because of the nonlinear image reconstruction. The regularization parameter λ controls the tradeoff between the noise reduction and preservation of structures in the image. The SVD (FIG. 6D) and wavelet (FIG. 6E) reconstructions preserve the structures more naturally. FIG. 7 shows the results of a dynamic experiment. FIGS. 7A and 7B illustrate results of dynamic PCASL with different PLDs, wherein FIG. 7A corresponds to SPIRiT and FIG. 7B corresponds to SPIRiT with CS. Enforcing temporal sparsity using CS helps to suppress both motion and noise. Significant improvement from CS can be seen in the cerebral blood flow (CBF) map calculated from this data (FIGS. 8A and 8B). FIG. 8A corresponds to SPIRiT and FIG. 8B corresponds to SPIRiT with CS.

The specific configurations, choice of materials and chemicals, and the size and shape of various elements can be varied according to particular design specifications or constraints requiring a system or method constructed according to the principles of the present disclosure. For example, while certain example ranges have been provided for the search windows and patch sizes, for example, other resolutions could be used depending on the application and the desired final image resolution. Such changes are intended to be embraced within the scope of the present disclosure. The presently disclosed embodiments, therefore, are considered in all respects to be illustrative and not restrictive. The scope of the present disclosure is indicated by the appended claims, rather than the foregoing description, and all changes that come within the meaning and range of equivalents thereof are intended to be embraced therein.

LIST OF REFERENCES

[1] Gunther et al. Single-shot 3D Imaging Techniques Improve Arterial Spin Labeling. Magnetic Resonance in Medicine, 54:491-498 (2005).
[2] Chen et al. Accelerated Multi-Spiral MRI Using Compressed Sensing with Temporal Constraints. Proceedings of International Society of Magnetic Resonance in Medicine, 6349 (2011).
[3] Fielden et al. Variable-flip Angle 3D-turbo Spin Echo Imaging Utiliting Spiral Acquisitions. Proceedings of International Society of Magnetic Resonance in Medicine, 2820 (2011).
[4] Buxton et al. A General Kinetic Model for Quantitative Perfusion Imaging with Arterial Spin Labeling, Magnetic Resonance in Medicine, 40:383-396 (1998).
[5] Lustig M, Pauly J. SPIRit: Iterative Self-consistent Parallel Imaging Reconstruction from Arbitrary k-space. Magnetic Resonance in Medicine. 2010; 64:457-471.
[6] Lingala S, Hu Y, Deibella E, et al. Accelerated Dynamic MRI Exploting Sparsity. IEEE TMI 2011; 30(5): 1042-1054.

What is claimed is:

1. A method, comprising:
acquiring magnetic resonance data associated with an area of interest of a subject, wherein the area of interest corresponds to at least one physiological activity of the subject; and
performing image reconstruction, comprising compressed sensing reconstruction, on at least a portion of the acquired magnetic resonance data,
wherein acquiring the magnetic resonance data comprises receiving data associated with arterial spin labeling (ASL) of the area of interest of the subject, and
wherein performing the image reconstruction comprises estimating a current state of the area of interest from image data corresponding to a past state of the area of interest based on spatiotemporal sparsity.

2. The method of claim 1, wherein the image data associated with arterial spin labeling of the area of interest of the subject comprises data associated with pseudocontinuous arterial spin labeling (PCASL) of the area of interest of the subject.

3. The method of claim 1, wherein performing the image reconstruction comprises performing nonlinear image reconstruction.

4. The method of claim 1, wherein performing the image reconstruction comprises performing iterative, non-Cartesian parallel image reconstruction.

5. The method of claim 1, wherein acquiring the magnetic resonance data comprises spiral k-space imaging of the area of interest of the subject.

6. The method of claim 1, wherein acquiring the magnetic resonance data comprises multi-dimensional turbo spin echo (TSE) stack-of-spirals sampling.

7. The method of claim 6, wherein the multi-dimensional TSE stack-of-spirals sampling comprises undersampled spiral k-space data.

8. The method of claim 6, wherein each of a plurality of echo trains associated with the TSE, stack-of-spirals sampling are configured to sample a respective one of a plurality of spiral interleaves.

9. The method of claim 1, further comprising generating one or more data map[s] associated with at least a portion of the acquired magnetic resonance data.

10. The method of claim 9, wherein generating the one or more data map[s] comprises generating a parameter map associated with at least one of cerebral blood flow (CBF), cerebral blood volume (CBV), arterial transit time (ATT), and arterial transit delay (ATD) in the area of interest of the subject.

11. The method of claim 9, wherein generating the one or more data map[s] comprises generating a perfusion map associated with blood flow in the area of interest of the subject.

12. The method of claim 1, further comprising displaying a visual representation of at least a portion of reconstructed images generated by performing the image reconstruction.

13. A system, comprising:
a magnetic resonance imaging (MRI) device;
one or more processors in communication with the MRI device; and
at least one memory device in communication with the one or more processors, storing computer-readable instructions that, when executed by the one or more processors, cause the system to:
acquire magnetic resonance data associated with an area of interest of a subject, wherein the area of interest corresponds to at least one physiological activity of the subject; and
perform image reconstruction, comprising compressed sensing reconstruction, on at least a portion of the acquired magnetic resonance data,
wherein acquiring the magnetic resonance data comprises receiving data associated with arterial spin labeling (ASL) of the area of interest of the subject, and
wherein performing the image reconstruction comprises estimating a current state of the area of interest from image data corresponding to a past state of the area of interest based on spatiotemporal sparsity.

14. The system of claim 13, wherein the image data associated with arterial spin labeling of the area of interest of the subject comprises data associated with pseudocontinuous arterial spin labeling (PCASL) of the area of interest of the subject.

15. The system of claim 13, wherein performing the image reconstruction comprises performing nonlinear image reconstruction.

16. The system of claim 13, wherein performing the image reconstruction comprises performing iterative, non-Cartesian parallel image reconstruction.

17. The system of claim 13, wherein acquiring the magnetic resonance data comprises spiral k-space imaging of the area of interest of the subject.

18. The system of claim 13, wherein acquiring the magnetic resonance data comprises multi-dimensional turbo spin echo (TSE) stack-of-spirals sampling.

19. The system of claim 18, wherein the multi-dimensional TSE stack-of-spirals sampling comprises undersampled spiral k-space data.

20. The system of claim 18, wherein each of a plurality of echo trains associated with the TSE, stack-of-spirals sampling are configured to sample a respective one of a plurality of spiral interleaves.

21. The system of claim 13, wherein the computer-readable instructions comprise instructions that, when executed by the one or more processors, cause the system to generate one or more data map[s] associated with at least a portion of the acquired magnetic resonance data.

22. The system of claim 21, wherein generating the one or more data map[s] comprises generating a parameter map associated with at least one of cerebral blood flow (CBF), cerebral blood volume (CBV), arterial transit time (ATT), and arterial transit delay (ATD) in the area of interest of the subject.

23. The system of claim 21, wherein generating the one or more data map[s] comprises generating a perfusion map associated with blood flow in the area of interest of the subject.

24. The system of claim 13, wherein the computer-readable instructions comprise instructions that, when executed by the one or more processors, cause the system to display a visual representation of at least a portion of reconstructed images generated by performing the image reconstruction.

25. A computer-readable storage medium having stored computer-executable instructions that, when executed by one or more processors, cause a computer to perform functions comprising:
acquiring magnetic resonance data associated with an area of interest of a subject, wherein the area of interest corresponds to at least one physiological activity of the subject; and
performing image reconstruction, comprising compressed sensing reconstruction, on at least a portion of the acquired magnetic resonance data,
wherein acquiring the magnetic resonance data comprises receiving data associated with arterial spin labeling (ASL) of the area of interest of the subject,
wherein performing the image reconstruction comprises estimating a current state of the area of interest from image data corresponding to a past state of the area of interest based on spatiotemporal sparsity.

26. The computer-readable medium of claim 25, wherein the image data associated with arterial spin labeling of the area of interest of the subject comprises data associated with pseudocontinuous arterial spin labeling (PCASL) of the area of interest of the subject.

27. The computer-readable medium of claim 25, wherein performing the image reconstruction comprises performing nonlinear image reconstruction.

28. The computer-readable medium of claim 25, wherein performing the image reconstruction comprises performing iterative, non-Cartesian parallel image reconstruction.

29. The computer-readable medium of claim 25, wherein acquiring the magnetic resonance data comprises spiral k-space imaging of the area of interest of the subject.

30. The computer-readable medium of claim 25, wherein acquiring the magnetic resonance data comprises multi-dimensional turbo spin echo (TSE) stack-of-spirals sampling.

31. The computer-readable medium of claim 30, wherein the multi-dimensional TSE stack-of-spirals sampling comprises undersampled spiral k-space data.

32. The computer-readable medium of claim 30, wherein each of a plurality of echo trains associated with the TSE stack-of-spirals sampling are configured to sample a respective one of a plurality of spiral interleaves.

33. The computer-readable medium of claim 25, wherein the functions further comprise generating one or more data map[s] associated with at least a portion of the acquired magnetic resonance data.

34. The computer-readable medium of claim 33, wherein generating the one or more data map[s] comprises generating a parameter map associated with at least one of cerebral blood flow (CBF), cerebral blood volume (CBV), arterial transit time (ATT), and arterial transit delay (ATD) in the area of interest of the subject.

35. The computer-readable medium of claim 33, wherein generating the one or more data map[s] comprises generating a perfusion map associated with blood flow in the area of interest of the subject.

36. The computer-readable medium of claim 25, wherein the functions further comprise displaying a visual representation of at least a portion of reconstructed images generated by performing the image reconstruction.

37. A method, comprising:
acquiring magnetic resonance data associated with an area of interest of a subject, wherein the area of interest corresponds to at least one physiological activity of the subject; and
performing image reconstruction, comprising compressed sensing reconstruction, on at least a portion of the acquired magnetic resonance data,
wherein acquiring the magnetic resonance data comprises multi-dimensional turbo spin echo (TSE) stack of spirals sampling and receiving data associated with arterial spin labeling (ASL) of the area of interest of the subject.

38. The method of claim 37, wherein the image data associated with arterial spin labeling of the area of interest of the subject comprises data associated with pseudocontinuous arterial spin labeling (PCASL) of the area of interest of the subject.

39. The method of claim 37, wherein performing the image reconstruction comprises performing nonlinear image reconstruction.

40. The method of claim 37, wherein performing the image reconstruction comprises performing iterative, non-Cartesian parallel image reconstruction.

41. The method of claim 37, wherein performing the image reconstruction comprises estimating a current state of the area of interest from image data corresponding to at least one of a past, present, or future state of the area of interest based on at least one of spatial and temporal sparsity.

42. The method of claim 37, wherein acquiring the magnetic resonance data comprises spiral k-space imaging of the area of interest of the subject.

43. The method of claim 37, wherein the multi-dimensional TSE stack-of-spirals sampling comprises undersampled spiral k-space data.

44. The method of claim 37, wherein each of a plurality of echo trains associated with the TSE, stack-of-spirals sampling are configured to sample a respective one of a plurality of spiral interleaves.

45. The method of claim 37, further comprising generating one or more data maps associated with at least a portion of the acquired magnetic resonance data.

46. The method of claim 45, wherein generating the one or more data maps comprises generating a parameter map associated with at least one of cerebral blood flow (CBF), cerebral blood volume (CBV), arterial transit time (ATT), and arterial transit delay (ATD) in the area of interest of the subject.

47. The method of claim 45, wherein generating the one or more data maps comprises generating a perfusion map associated with blood flow in the area of interest of the subject.

48. The method of claim 37, further comprising displaying a visual representation of at least a portion of reconstructed images generated by performing the image reconstruction.

49. A system, comprising:
a magnetic resonance imaging (MRI) device;
one or more processors in communication with the MRI device; and
at least one memory device in communication with the one or more processors storing computer-readable instructions that, when executed by the one or more processors, cause the system to:
acquire magnetic resonance data associated with an area of interest of a subject, wherein the area of interest corresponds to at least one physiological activity of the subject; and
perform image reconstruction, comprising compressed sensing reconstruction, on at least a portion of the acquired magnetic resonance data,
wherein acquiring the magnetic resonance data comprises multi-dimensional turbo spin echo (TSE) stack of spirals sampling and receiving data associated with arterial spin labeling (ASL) of the area of interest of the subject.

50. The system of claim 49, wherein the image data associated with arterial spin labeling of the area of interest of the subject comprises data associated with pseudocontinuous arterial spin labeling (PCASL) of the area of interest of the subject.

51. The system of claim 49, wherein performing the image reconstruction comprises performing nonlinear image reconstruction.

52. The system of claim 49, wherein performing the image reconstruction comprises performing iterative, non-Cartesian parallel image reconstruction.

53. The system of claim 49, wherein performing the image reconstruction comprises estimating a current state of the area of interest from image data corresponding to at least one of a past, present, and future state of the area of interest based on at least one of spatial and temporal sparsity.

54. The system of claim 49, wherein acquiring the magnetic resonance data comprises spiral k-space imaging of the area of interest of the subject.

55. The system of claim 49, wherein the multi-dimensional TSE stack-of-spirals sampling comprises undersampled spiral k-space data.

56. The system of claim 49, wherein each of a plurality of echo trains associated with the TSE, stack-of-spirals sampling are configured to sample a respective one of a plurality of spiral interleaves.

57. The system of claim 49, wherein the computer-readable instructions comprise instructions that, when executed by the one or more processors, cause the system to generate one or more data maps associated with at least a portion of the acquired magnetic resonance data.

58. The system of claim 57, wherein generating the one or more data maps comprises generating a parameter map associated with at least one of cerebral blood flow (CBF), cerebral blood volume (CBV), arterial transit time (ATT), and arterial transit delay (ATD) in the area of interest of the subject.

59. The system of claim 57, wherein generating the one or more data maps comprises generating a perfusion map associated with blood flow in the area of interest of the subject.

60. The system of claim 49, wherein the computer-readable instructions comprise instructions that, when executed by the one or more processors, cause the system to display a visual representation of at least a portion of reconstructed images generated by performing the image reconstruction.

61. A computer-readable storage medium having stored computer-executable instructions that, when executed by one or more processors, cause a computer to perform functions comprising:
acquiring magnetic resonance data associated with an area of interest of a subject, wherein the area of interest corresponds to at least one physiological activity of the subject; and
performing image reconstruction, comprising compressed sensing reconstruction, on at least a portion of the acquired magnetic resonance data,
wherein acquiring the magnetic resonance data comprises multi-dimensional turbo spin echo (TSE) stack of spirals sampling and receiving data associated with arterial spin labeling (ASL) of the area of interest of the subject.

62. The computer-readable storage medium of claim 61, wherein the image data associated with arterial spin labeling of the area of interest of the subject comprises data associated with pseudocontinuous arterial spin labeling (PCASL) of the area of interest of the subject.

63. The computer-readable storage medium of claim 61, wherein performing the image reconstruction comprises performing nonlinear image reconstruction.

64. The computer-readable storage medium of claim 61, wherein performing the image reconstruction comprises performing iterative, non-Cartesian parallel image reconstruction.

65. The computer-readable storage medium of claim 61, wherein performing the image reconstruction comprises estimating a current state of the area of interest from image data corresponding to at least one of a past, present, and future state of the area of interest based on at least one of spatial and temporal sparsity.

66. The computer-readable storage medium of claim 61, wherein acquiring the magnetic resonance data comprises spiral k-space imaging of the area of interest of the subject.

67. The computer-readable storage medium of claim 61, wherein the multi-dimensional TSE stack-of-spirals sampling comprises undersampled spiral k-space data.

68. The computer-readable storage medium of claim 61, wherein each of a plurality of echo trains associated with the TSE, stack-of-spirals sampling are configured to sample a respective one of a plurality of spiral interleaves.

69. The computer-readable storage medium of claim 61, wherein the functions further comprise generating one or more data maps associated with at least a portion of the acquired magnetic resonance data.

70. The computer-readable storage medium of claim 69, wherein generating the one or more data maps comprises generating a parameter map associated with at least one of cerebral blood flow (CBF), cerebral blood volume (CBV), arterial transit time (ATT), and arterial transit delay (ATD) in the area of interest of the subject.

71. The computer-readable storage medium of claim 69, wherein generating the one or more data maps comprises generating a perfusion map associated with blood flow in the area of interest of the subject.

72. The computer-readable storage medium of claim 61, wherein the functions further comprise displaying a visual representation of at least a portion of reconstructed images generated by performing the image reconstruction.

* * * * *